US006735742B2

(12) United States Patent
Hatsch et al.

(10) Patent No.: US 6,735,742 B2
(45) Date of Patent: May 11, 2004

(54) METHOD FOR OPTIMIZING A CELL LAYOUT USING PARAMETERIZABLE CELLS AND CELL CONFIGURATION DATA

(75) Inventors: Joel Hatsch, München (DE); Winfried Kamp, München (DE); Ronald Künemund, Dietramszell (DE); Eva Lackerschmid, München (DE); Heinz Söldner, Bruckmühl-Heufeldmühle (DE)

(73) Assignee: Infineon Technologies AG, Munich (DE)

( * ) Notice: Subject to any disclaimer, the term of this patent is extended or adjusted under 35 U.S.C. 154(b) by 63 days.

(21) Appl. No.: 09/864,979

(22) Filed: May 24, 2001

(65) Prior Publication Data

US 2002/0006695 A1 Jan. 17, 2002

(30) Foreign Application Priority Data

May 24, 2000 (DE) .......................... 100 25 583

(51) Int. Cl.[7] .......................... G06F 17/50; G06F 9/455
(52) U.S. Cl. ........................ 716/2; 716/8; 716/9; 716/11
(58) Field of Search ................... 716/1–19, 21

(56) References Cited

U.S. PATENT DOCUMENTS

| 5,384,710 | A | * | 1/1995 | Lam et al. ................... 716/11 |
| 5,594,657 | A | * | 1/1997 | Cantone et al. ............... 716/16 |
| 5,633,807 | A | * | 5/1997 | Fishburn et al. .............. 716/19 |
| 5,666,288 | A | | 9/1997 | Jones et al. .................... 716/17 |
| 5,764,533 | A | * | 6/1998 | deDood ........................ 716/8 |
| 5,824,570 | A | | 10/1998 | Aoki et al. .................... 438/128 |
| 5,896,300 | A | * | 4/1999 | Raghavan et al. ........... 716/10 |
| 6,058,252 | A | * | 5/2000 | Noll et al. .................... 716/10 |
| 6,216,258 | B1 | * | 4/2001 | Mohan et al. ................ 716/17 |
| 6,249,901 | B1 | * | 6/2001 | Yuan et al. .................... 716/5 |
| 6,260,182 | B1 | * | 7/2001 | Mohan et al. ................ 716/12 |
| 6,286,126 | B1 | * | 9/2001 | Raghavan et al. ........... 716/6 |
| 6,289,412 | B1 | * | 9/2001 | Yuan et al. .................... 711/11 |
| 6,292,925 | B1 | * | 9/2001 | Dellinger et al. ............. 716/8 |

FOREIGN PATENT DOCUMENTS

DE 196 39 431 4/1998 .......... G06F/17/50

OTHER PUBLICATIONS

W. Cory, Layla: A VLSI Layout Language, Proceedings of the 22nd ACM/IEEE Conference on Design Automation, pp. 245–251, Jun. 1985.*

* cited by examiner

Primary Examiner—A. M. Thompson
(74) Attorney, Agent, or Firm—Laurence A. Greenberg; Werner H. Stemer; Ralph E. Locher (57) ABSTRACT

A method for optimizing the layout of cells of an integrated circuit includes providing a cell-based network list with references to cell definitions with parameterizable dimensions, calculating a layout of an integrated circuit using the cell-based network list, extracting a primary network list from the layout, optimizing the component dimensions of at least some of the components of the integrated circuit using at least one predetermined optimization parameter and a simulation using the primary network list, creating an optimized secondary network list using the results of the component optimization, and automatically modifying the layout with respect to cell dimensions using a secondary network list.

21 Claims, 5 Drawing Sheets

METHOD FOR OPTIMIZING A CELL LAYOUT USING PARAMETERIZABLE CELLS AND CELL CONFIGURATION DATA

BACKGROUND OF THE INVENTION

FIELD OF THE INVENTION

The invention relates to a method for optimizing the cell layout and the cell arrangement on an integrated semiconductor.

In the creation of integrated circuits, circuit description languages are usually used, for example a high level language such as VHDL. A further possibility for circuit creation is to use a so-called schematic, a symbol-based item of information about the circuit, which can in turn be generated from a circuit description. Finally, it is also possible to design the circuit with the aid of a data path generator. The circuit described in this way must subsequently be converted into a layout which forms the basis of the graphical information which represents the components used for the integrated circuit on a semiconductor.

For this purpose, firstly a cell-based network list (CBN) is created. This is done with the aid of a synthesis program if a circuit description language such as VHDL or Verilog is used, and with the aid of an extraction program if a schematic is used.

The CBN is a hierarchically structured list of all the cells used for the circuit and the connections between the cells. A cell is understood to be a unit of functionally associated components or cells. This is because a cell can in turn be constructed from individual cells on account of the hierarchical structure of the CBN. During the creation of the CBN, the programs used access a so-called cell library which contains information about standard cells. In this case, a standard cell is a frequently used, very small unit of components with a defined function. An example of a standard cell may be an inverter formed from two transistors. Various items of information about the properties of the standard cells are stored in the standard cell library. These are grouped into so-called "views", in accordance with their principal use with different representation and calculation programs. In this case, the layout view contains information about the structure of a cell in the two-dimensional extent of its components on the various exposure masks. This view in each case contains data for definition of the various polygons required for fabricating the cell. The schematics view describes the appearance of the cell in the circuit diagram of a schematic. The VHDL and Verilog views describe the cell in each of these programming languages. The timing view describes the temporal behavior of the cell when signals are applied to the inputs of the cell. The abstract view contains definitions with regard to the contour of the cell and the positions of the individual connections. During the concrete calculation of a screen, printer or exposure-device output of circuit data, the programs used access the cell library in order to use the information stored therein for calculating an output. As the bottommost hierarchical level, the standard cells provide the information about the appearance of the circuit in concretized form. Programs for processing VHDL programs also resort to the cell library in order to be able to process corresponding references in the VHDL program.

In addition to designators and connections, the CBN also contains references to said cell library, which are evaluated in later steps. A standard cell library contains many standard cells, for example an inverter, in various manifestations which differ in terms of their driver capability and thus also in terms of the size, number and arrangement of the components situated in the cell. The driver capability of a component or of its cell describes its ability to supply further components with voltage or current. The programs for generating the CBN are able to use indications in the circuit description or inherent knowledge about necessities of driver strengths or the like to select one of the various standard cells of a cell type and create a corresponding reference in the CBN to this standard cell.

A so-called layout is calculated in the next step. In this case, the methods used are differentiated into so-called "full custom" methods, in which the placement and dimensioning of the individual components are effected manually, and "semi custom" methods, in which the critical steps are carried out in an automated manner. The "semi custom" method, on which, moreover, the invention is based, will be described below. The layout is created by means of a program for placement and routing, i.e. the arrangement of the cells defined in the CBN next to one another and the connection of the terminal contacts of the cells in accordance with the specifications of the CBN. In this case, the programs used follow the hierarchical structure of the CBN and attempt to arrange in spatial proximity associated cells which, for example, are combined at a higher hierarchical level to form a larger cell. This arrangement is effected with the aid of information—obtained from the cell library—about the contour or the concrete layout of the respective cells to be placed (abstract or layout view). There are algorithms available for this purpose which generally attempt to minimize the overall area used and, at the same time, to optimize the connecting paths (interconnection) between the individual cells. The routing defines this electrical interconnection of the cells to one another and to the power supply lines. There are algorithms available for this purpose, too, which attempt to minimize the interconnect length used by the overall circuit. In order to attain this aim as far as possible, a customary method of arranging the cells consists in putting them into rows which have a respectively identical height, or into rows which all have the same height, in order, in this way, to enable the cells to be supplied with power in a continuous, linearly extending manner.

The result of the placement/routing is the layout, a database created in binary data and containing information about the arrangement of the cells of the planned circuit relative to one another using coordinates on an area, designators of the cells, references to cells of a lower hierarchical level or to standard cells from the cell library and information about the course of the interconnects to be arranged in the interconnection planes.

The layout is subsequently used for producing masks for exposure of the semiconductor.

In order, however, that the actual functional capability of the semiconductor that can be produced in this way can already be tested at the outset, and without major costs, various analysis and optimization tools have been developed.

In order to check the functional capability, generally a so-called simulator is initially used. For the purpose of simulation, a network list containing information about the electrical elements used in the layout is created from the layout by means of an extraction program. In terms of its syntax, this network list generally corresponds to the cell-based network list but is extended. The network list includes information about the arrangement and the appearance of the individual cells, but also contains further-reaching information, for example about the components used in the cells, expected capacitive coupling between two or more interconnects, and information about the influence on adjacent components. Thus, the network list created in this way is a more detailed version of the CBN which also incorporates information which is not actually available until after the creation of a concrete layout and thus the definition of the arrangement and connection of the cells to one another. The more information about the layout that is incorporated into the network list, the more precisely the subsequent simulation can be carried out. The simulation uses given physical and electrical laws to test whether the layout of the integrated circuit and the circuit itself correspond to the requirements. If the requirements are not met, the circuit can be changed by exchanging specific cells which, for example, have a higher driver capability. However, this presupposes the presence of such replacement cells with suitable dimensioning. Usually, as mentioned, there are only a few variations of each cell available in the cell library. Sometimes, although the cells used are strong enough to satisfy the requirements imposed, they are often overdimensioned, which results in the circuit consuming too much current and producing more heat. Moreover, this manipulation of the cell dimensioning requires a trial and error approach since occasionally it is unclear what cells have to be changed in what way.

In order to be able to make clearer statements in this regard, additionally optimization programs are used, therefore, which optimize the circuit according to the predetermined parameters (power, area, speed). These programs define the simulated currents within the simulated semiconductor and usually determine a so-called critical path. The critical path is an electrical conductor or signal path between a specific input of the circuit and an output of the circuit which turns out to be the worst signal path according to predetermined optimization parameters. By way of example, if the circuit is to be optimized according to the optimization parameter speed, the critical path is that path through the circuit which is the slowest, that is to say has the longest propagation time from the input of a signal at the input of the circuit until the appearance of an output signal at an output of the circuit. Parts or regions of a circuit can also be optimized in this way.

It is also possible to assess the circuit according to other optimization parameters, for example according to the area, which is to be as small as possible, or according to power loss minimization. In the case of area minimization, too, it is possible to work with critical paths which then assess the areas of the individual signal paths given predetermined limit values for other parameters, or power loss resulting from them.

After the critical path of the circuit has been ascertained, a causality ascertainment is carried out, in which the critical cell(s) in the critical path is or are identified. In the subsequent step, the dimensions of the components of the cells assessed as critical are adapted until the critical path exhibits an improved behavior and no longer represents that path having the worst behavior of all possible paths within the circuit and the semiconductor.

This optimization method will be applied a number of times to the circuit to be examined, or the semiconductor to be examined, a new critical path being determined and optimized in each case. After the optimization process, a new network list is created, which, in contrast to the primary network list, is to be designated as the secondary network list. The latter now contains the information which would be required by the person skilled in the art in order to adapt the cells in the layout to the optimized conditions, as additional dimensioning information for the components. However, customary programs for synthesis of the CBN only generate CBNs with fixed references to specific standard cells which always have fixed dimensionings.

This problem of flexible adaptation of the layout could be solved by means of parameterizable cells. With these cells, it would be possible for the required driver capability to be set exactly. In order to adapt to the given driver capability, the cell can grow or shrink practically in a continuously variable manner. Thus, the cells with the new driver capability would not necessarily have exactly the same height and width as their adjacent cells, so that these would have to be shifted or made larger or smaller in order once again to attain a uniform row height, insofar as this is desirable in the integrated semiconductor. Although the use of parameterizable cells would solve the problem of the limited manifestations of the cells, it nonetheless entails numerous difficulties:

The conventional synthesis programs or data path generators cannot handle parameterizable cells; in particular, they cannot set the driver capability because they were developed for fixed cells.

The geometry of the cells changes when other driver capabilities are set. This gives rise to gaps or overlaps between the cells. Although conventional programs can again order the cells next to one another, they are unable to configure the height of the cells in a row uniformly again.

These geometrical changes require a new interconnection of the cells and, consequently, influence the local values and ratios of the resistances and capacitances of the interconnection between the cells.

The changes have to be carried out cell by cell. Since a customary circuit design consists of several thousand cells, this method cannot be carried out practicably.

U.S. Pat. No. 5,666,288 discloses a method and a device for designing an integrated electrical circuit in which newly generated cells are added to a standard cell library. The new cells are verified in respect of their desired predetermined logic function. Afterward, a renewed placement and routing method is carried out for the circuit with the new cells.

U.S. Pat. No. 5,824,570 describes a method for designing an integrated electrical circuit. The method describes the generation of new cells for a cell library, but no method for optimizing the layout of cells in an electrical circuit.

DE 196 39 431 A1 describes a method for fabricating integrated circuits with parameterizable standard cells of a standard cell library. In the method, the placement and interconnection of the standard cells are additionally followed by definition of design parameters of the standard cells, in which case, for example, local layout changes through to local connections between standard cells are possible and a minimal power loss consumption is possible, since the speed requirements imposed on the IC can be precisely fulfilled in this way.

SUMMARY OF THE INVENTION

The present invention is based on the object, therefore, of making the use of parameterizable cells accessible to automated semiconductor project planning (semi custom).

This object is achieved by means of the method for optimizing the cell arrangement on an integrated semiconductor, and the the device for designing semiconductors an apparatus for designing semiconductors, and the program object for a parameterizable cell for a cell library for designing integrated circuits.

Further advantageous configurations, aspects and details of the present invention emerge from the dependent patent claims, the description and the accompanying drawings.

The basic concept underlying the invention is that of creating an automated return from the existing optimization programs to the layout creation.

For this purpose, by simulation of a layout, the dimensions (area extents) of components used in a circuit are optimized and the dimensions thus obtained are written back into the layout, whereupon the cells defined in the layout are adapted to the altered component dimensions and changes that may be necessary in the arrangement of the cells are made.

The invention is therefore directed at a method for optimizing the layout of cells of an integrated circuit, having the following steps:

provision of a cell-based network list with references to cell definitions with parameterizable dimensions;

calculation of a layout of an integrated circuit using the cell-based network list;

extraction of a primary network list from the layout;

optimization of the component dimensions of at least some of the components of the integrated circuit using at least one predetermined optimization parameter and a simulation using the primary network list;

creation of an optimized secondary network list using the results of the component optimization; and automatic modification of the layout in respect of the cell dimensions using the secondary network list.

Component and cell dimensions are to be understood as the dimensions of the components and cells of integrated circuits, that is to say usually their two-dimensional dimensions in plan view, but, if appropriate, likewise their depth extent into the integrated semiconductor, for example when vertical transistors are used.

The at least one predetermined optimization parameter is a physical or electrical quantity toward which the integrated semiconductor is to be optimized. If appropriate, an optimization parameter can also be understood to the effect of actually achieving a functional capability of the circuit.

As described above, a cell-based network list is a textual, hierarchical definition of all the cells used in an integrated circuit. At the bottommost hierarchical level, the network list refers to a cell library in which the properties of cells are defined. Whereas recourse is often had to standard cell libraries with cell definitions in fixed cell dimensionings, the present invention instead uses a cell library in which the cells are parameterizable. In addition to the actual references, the cell-based network list can thus also contain details on the dimensions of the components to which reference is made. These are automatically calculated, and concomitantly transferred, when the cell definitions are called up, so that the cells can furnish back corresponding details.

As an alternative, the cell-based network list may also have references to a standard cell library, in which case, however, when the cells are called up, the corresponding standard cell library is not called up but rather merely a reference list which allocates to each of the cells of the standard library a cell of a cell library having variable cells, information about the dimensions of the individual standard cells additionally being contained in the reference list and being transferred during call-up. In this way, it is possible, for example, to map all inverter types contained in a standard cell library onto a general, parameterizable inverter type which can be designed differently depending on dimension details.

The use of a cell-based network list with parameterized references of one type or another is necessary in order to be able to generate in the subsequent step, using the conventional placement and routing programs, a layout containing the details on the dimensions of the cells as parameters. The subsequent manipulation of the dimension data of the layout is made possible in this way.

The layout generated is a binary data object which contains information about the spatial positioning of the cells used in a circuit, their designations (designators, which are usually simply accepted from the cell-based network list), references to the cell definitions responsible for the cells in the cell library and spatial routing information about the interconnect connections between the contact points of the cells. The layout used according to the invention additionally contains information about the dimensioning of the cells.

A layout usually uses a coordinate system with X and Y coordinates in order to define the positioning of reference points of the cells and the courses of the interconnects. In this case, the reference points of the cells can be defined differently, for example as one of the corner points of the cell or as its central point. In the case of a three-dimensional arrangement of components in a semiconductor or the use of components on edge, such as vertical transistors, the coordinate system can also take account of a Z coordinate perpendicular to the X and Y coordinates.

In the next step of the method according to the invention, a primary network list is generated by means of extraction from the layout. A primary network list is to be understood as a network list which, with the aid of an extraction program, for example, encompasses all the electrical components and their conditions with respect to one another and all the electrical quantities in a hierarchical data structure.

According to the invention, a simulation based on the primary network list is carried out in order to discover critical aspects of the circuit which can be optimized and, after optimization of the component dimensions, to be able to check the success. The inventive ingenuity of the method resides in the fact that automatic coupling is effected between the optimized secondary network list that is generated and the layout. Since optimization programs that can be used can alter the component dimensions in a continuum, it is now possible, circumventing the conventional cell library, to provide the layout directly with that value of a component dimension which has been found to be optimal. As a result of this, optimally adapted component dimensions can be used as a basis for the subsequent renewed calculation of the layout data. Directly changing the dimensions of components on the layout entails the fact that, during the later recalculation of the layout, the relative positions of the cells with respect to one another are already predetermined and, consequently, no longer have to be newly calculated. The electrical behavior of the circuit thus changes the least and the computation complexity is the least. When structures that are to be dimensioned in a three-dimensional fashion are used, such as vertical transistors for instance, the height of the cells or of their components may also be a dimension of the spatial distribution of the cells. As already explained above, there are components present in cells which create additional electrical surroundings of the actual components.

In order that the positions obtained during the first calculation of the layout data are not disturbed unnecessarily and hence the renewed calculation of the layout is not configured in an unnecessarily complex manner, it may furthermore be preferred for the relative positions of the cells with respect to one another not to be significantly altered during the renewed calculation. This is achieved through the use of the layout with parameterizable cells and the writing of the alterations directly into the layout.

The provision of the cell-based network list may preferably have the following steps:

generation of a cell-based basic network list from a circuit description, a schematic or by means of a data path generator, which contain references to cell definitions of a standard cell library with fixed dimensions;

identification of suitable cell definitions of a cell library with parameterizable dimensions for at least some of the cells of the cell-based basic network list; and generation of the cell-based network list from the cell-based basic network list, in which, instead of the references to cell definitions of the standard library, corresponding references to suitable cell definitions of the cell library with parameterizable dimensions are used, in which case, in the cell-based network list, the references contain additional details about the dimensions of the components, which can be transferred as parameters to the cell definitions and which correspond to the respective dimensions of the components of the standard cell library to which the references of the cell-based basic network list refer.

In an alternative embodiment to this embodiment, the cell-based network list is not altered, rather the standard cell library is exchanged. Consequently, the references in the CBN do not change, but they no longer refer to an actual standard cell library but rather to a library which, for its part, in turn contains for each of the standard cells only references to correspondingly suitable cells in a variable cell library and information about the dimensionings of the individual components of the standard cells, which can be forwarded as parameters to the parameterizable cells in the variable cell library. It is particularly preferred for details about the parameterizable dimensions of cells to be also taken over into the layout. In this way, the details about the dimensions of the cells can later be altered in a particularly simple manner.

In particular, the cells can be arranged in rows, the sequence of the cells in a row not being altered during the renewed calculation. Moreover, it is preferred for the cells in the layout to be arranged in rows in which all cells belonging to a row have the same height.

As already discussed above, various optimization parameters can be used for optimizing the semiconductor. These may be, for example, the switching speed of the integrated circuit, the area requirement of the circuit or the power loss of the circuit, in which case it is also possible for more than one optimization parameter to be used at the same time and it is possible to perform weighting in the consideration of the optimization parameters.

The optimization itself preferably has the following steps:

simulation of the integrated circuit using the primary network list;

discovery of a critical signal path in the simulated circuit; and optimization of the behavior of the critical signal path by variation of the component dimensions of the cells contained in it.

The steps of the optimization process can also be iterated a number of times. As a result of this, it is possible not only to detect the most critical signal path. Customary optimization programs iterate the optimization step for all the signal paths anyway, so that the result of an optimization carried out with them is overall an optimized circuit. It is additionally possible to apply the optimization program to the circuit a number of times and to carry out optimization in succession according to different criteria.

The automatic modification of the database may have the following steps:

comparison of the secondary network list with the primary network list;

discovery of components whose dimensioning has changed as a result of the optimization;

definition of designators of the changed components;

discovery of the components having the defined designators in the layout; and entry of the component size of the discovered components in accordance with the values of the secondary network list into the modified layout.

A designator is to be understood as an unambiguous designation of a specific component, for example a number or another type of designation. Using these designators, which are the same in the network list and in the layout or can be correlated with one another by means of a reference list, so that an unambiguous allocation exists at any rate, it is possible for all the changed components also to be discovered again in the layout, and for them to be modified correspondingly.

Finally, the automatic modification of the layout preferably has the following, additional step:

adaptation of the cell properties of cells with altered component dimensions to the altered component dimensions.

The customary simulation and optimization programs use, for their optimization, a network list (designated here as primary network list) which may contain entries for all the elements occurring in a circuit, such as cells, components, interconnects, coupling capacitances, etc. In this case, the actual optimization takes place at the level of the individual component which is newly dimensioned, in order to better satisfy the predetermined optimization criteria. During the dimensioning of the components, it can happen that the cell to which the component belongs is no longer appropriately dimensioned; either because, due to enlargement of the component, the area dedicated to the vie cell no longer suffices for accommodating the component, or because, due to shrinkage of the component, space on the area of the cell remains unutilized. In the first case, the cell must be adapted and this is expedient in the second case from the economic standpoint. The cell can be adapted in terms of area but also in terms of depth, for example when vertical transistors are used.

It may also be necessary to change cell properties other than just their size. Moreover, changes in other properties may result in subsequent changes to the sizes of the cells. It is an important property of the newly developed parameterizable cells which are used according to the invention that, during the modification of the cell dimensions, the cells themselves can calculate which changes have to be made in order to adapt the cell to the altered component dimensions. Upon the call-up of the cell definition in the cell library by the program which calculates or adapts the layout, the parameters that are transferred are dimensions of those (or else all) components which were altered in the optimization phase. Upon call-up of the views "Abstract" or "Layout", these parameters are used to perform internally in the cell definition adaptations of the cell which, for example, are passed back to the calling program as change in dimension of the entire cell or as an altered layout of the components contained in the cell. Consequently, the cells used in this way differ from conventional cells in that they are provided with built-in "intrinsic intelligence" which enables them to independently modify dimensioning and even the internal layout of a cell.

Consequently, the altered component dimensionings may have the effect that many cells become larger or smaller, resulting in gaps and/or overlaps between the cells. As a result, electrical connections would be interrupted, or short circuits arise. Therefore, the alteration of the cell dimensioning should be carried out in such a way that the individual cells of the integrated circuit are modified and placed in such a way that the area is again completely covered by cells, without overlaps occurring. In this way, a simple power supply, for example, is possible.

This can be done in a particularly advantageous manner by varying the form of the cell in its two extents until it again fits optimally into its environment, that is to say between the cells surrounding it.

Should matching no longer be possible on account of a cell increasing in size to a particularly large degree, it is additionally possible for the cells to be adapted to the altered dimensioning by division of the initial cell into a plurality of target cells which, connected together, have the same electrical properties as the initial cell.

As an alternative or in addition, cells can be adapted to the altered component dimensions by division of an altered original component into a plurality of target components which, connected together, have the same electrical properties as the original components. In this case, the newly created components, for example a plurality of transistors connected in parallel, remain together in a cell but form a new structure within the cell.

If the cells are arranged, or become arranged during the renewed layout, in rows in which all the cells have the same height, the cells can advantageously be adapted to the altered component dimension by their width being changed. In this preferred embodiment of the invention, it is again possible, in a particularly simple manner, to produce the electrical connection to the outside world. Accordingly, it is necessary to bring all the cells of a row to a uniform height. However, in contrast to the method known in the prior art, in which the standard cells generally have uniform heights, this height can differ from row to row, so that the area utilization can be optimized. In this case, a program automatically adapts the heights and widths of these cells, in which case it is possible to prescribe an optimization criterion, such as, for example, the minimum or a defined height, the width, the area of the cell row, etc. As a result, an attempt is also made to further optimize the total area of the circuit.

The cell definitions stored in the cell library comprise corresponding decision algorithms which are able to use predetermined criteria to decide which type of modification of the cell is the best variant in the context of the given optimized component dimensions, and, if appropriate, also in a manner dependent on further conditions—transferred from the executing layout program to the cell definition—such as, for example, the attempt by the layout program to produce a uniform cell height within a row of cells, and thus the specification of a fixed cell height as a further parameter in addition to the component dimensions, it is possible to influence the novel, parameterizable cell in respect of its calculation of the cell dimensioning and the internal construction of the cell.

The method according to the invention may furthermore be characterized in that the automatic modification of the layout has the following further steps:

placement of the cells on the integrated circuit; and
interconnection of the cells.

As described above, the altered cell dimensions could lead to gaps or overlaps on the area available for the circuit, since the altered component dimensions and hence their effect on the cells are initially entered into an unaltered layout, in which the reference coordinates of the cells have initially remained unaltered. Therefore, there preferably takes place a re-placement of the cells which are initially called up (e.g. via the View Abstract), in order to ascertain their altered dimensions. Afterward, the reference points of the cells are displaced, if appropriate, in order to cancel gaps and overlaps. Since the contact points of the cells are also displaced during this operation, it is then necessary also to adapt the interconnection by means of a new routing.

It must be emphasized that directly changing the cell dimensions in the layout does not necessitate a completely new placement/routing, rather only relatively small adaptations are carried out by means of a suitable program, so that the computation-intensive generation of layout is largely omitted. This has the further advantage of not calling into question the result of the optimization operation through a completely renewed layout.

Therefore, the method according to the invention may be characterized in that the placement of the cells is effected without any gaps by reference coordinates of the cells being adapted to the altered cell dimensions, the relative positions of the cells with respect to one another remaining unchanged.

The method will usually be present in the form of a data processing program and be carried out by a data processing system. In this case, the steps of the method may be grouped into programs which consolidate different functional areas of the method. By way of example, these programs may be called in a coordinated manner by means of scripts. This enables the processing, without human intervention, even of highly complex circuits in which each phase of the method can last for hours or days with currently available computer powers.

The invention is furthermore directed at an apparatus for designing semiconductors having a computing unit and a memory for storing a database, a primary network list, a secondary network list and a program which can be executed on the computing unit and can carry out or carries out the method according to the invention.

As already described, an important aspect of the present invention is the use of parameterizable cells which, compared with known parameterizable cells, have extended capabilities for influencing their internal structure. Therefore, the invention is finally directed at a program object for a parameterizable cell for a cell library for designing integrated circuits; the program object representing functionally related components whose dimensioning is variable, having an input interface for inputting the dimensions of components of the cell; a program area for calculating the structure of the components and the external dimensions of the whole cell as a function of the input dimensions of the components; and an output interface for outputting information about the structure of the components and the external dimensioning of the cell.

The actual program area is an algorithm which can be used for example in one of the typical programming languages for the generation of cell definitions and also serves to describe the polygons that are to be created for a cell. In this case, however, the function goes beyond the previously known, simple definition of polygons, since the program area also uses the incoming parameters to decide how the cell structure should appear and accordingly selects the definition of the polygons to be used.

The invention will be explained in more detail below, reference being made to the accompanying drawings, which illustrate the following.

Figure 1:
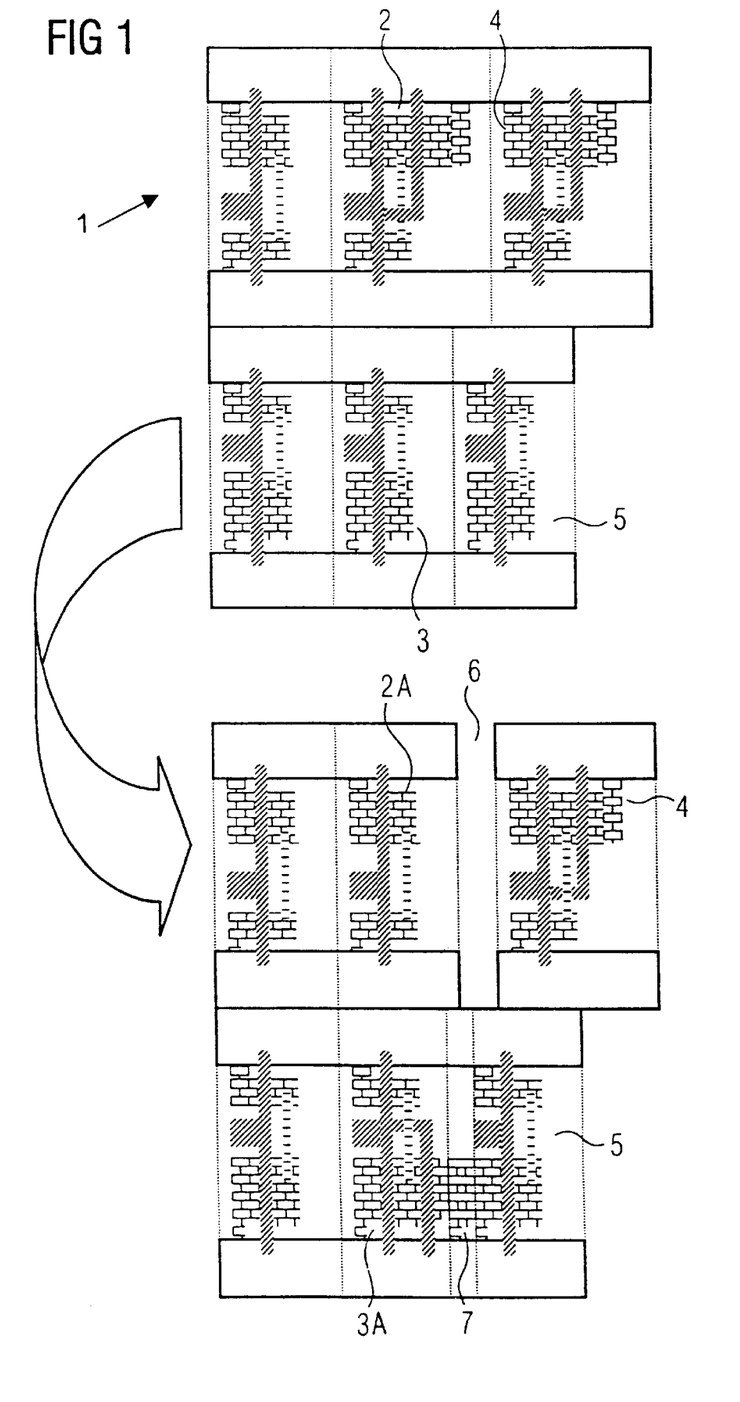
FIG. 1 is a diagram illustrating how gaps or overlaps can arise in a configuration of components and the cells surrounding them as a result of the cell size and component size being altered according to the invention.

FIG. 1 shows examples of changing the size of components and their cells in the event of changing their driver properties in the manner according to the invention. What is involved here is a detail from a row-shaped arrangement 1 of cells with two rows of cells illustrated, of which the cell 2a is reduced in size compared to cell 2 as a result of the optimization, whereas the cell 3a is enlarged compared to cell 3. Therefor, a gap 6 arises in the region between the size-reduced cell 2a and cell 4; by contrast, an overlap 7 arises in the transition region between the cell 3a and the cell 5. Such overlaps and gaps are eliminated by the re-placement according to the invention.

Figure 2A:
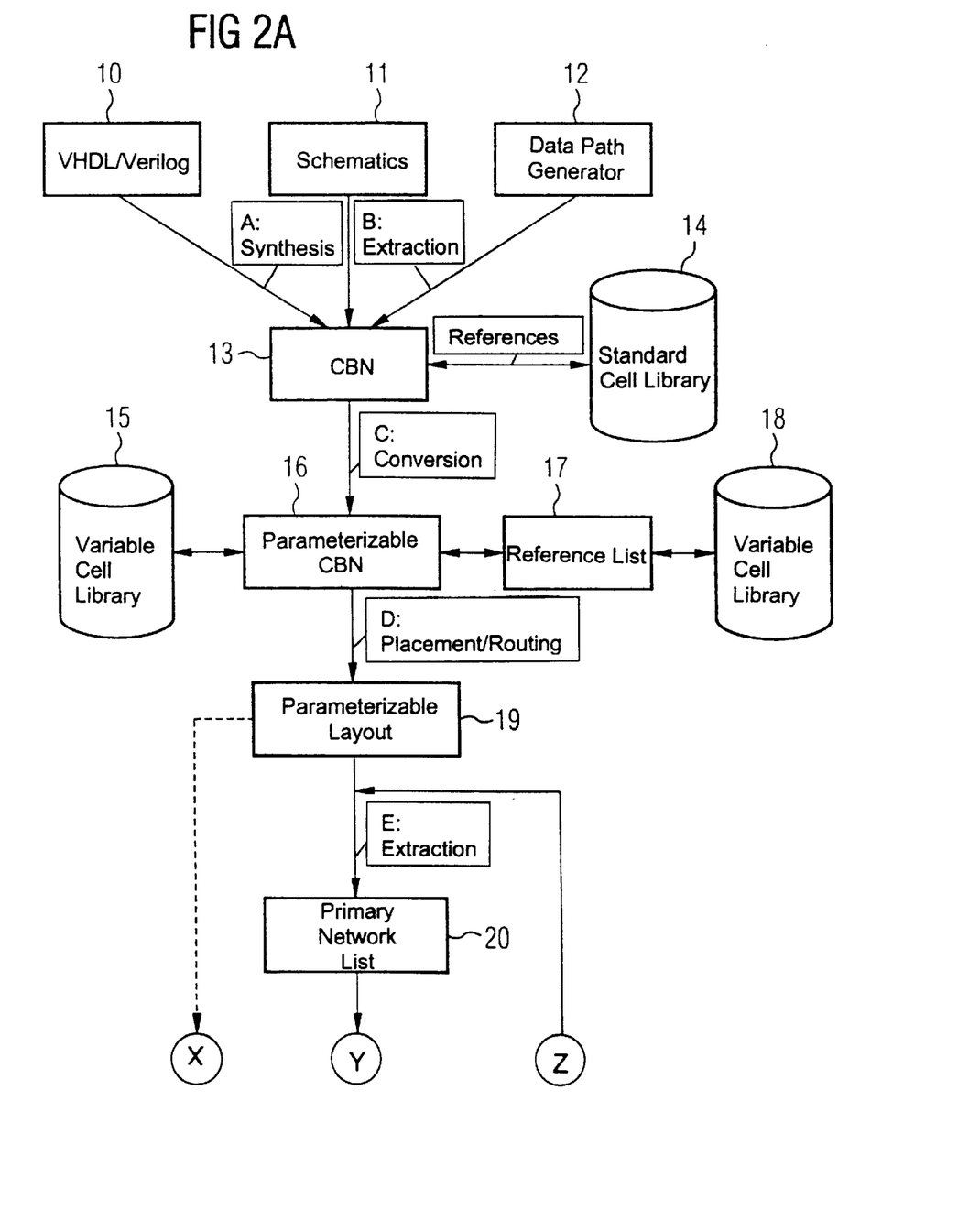
FIGS. 2A and 2B taken together are a flow of the implementation of the method according to the invention (desing flow)
Figure 2B:
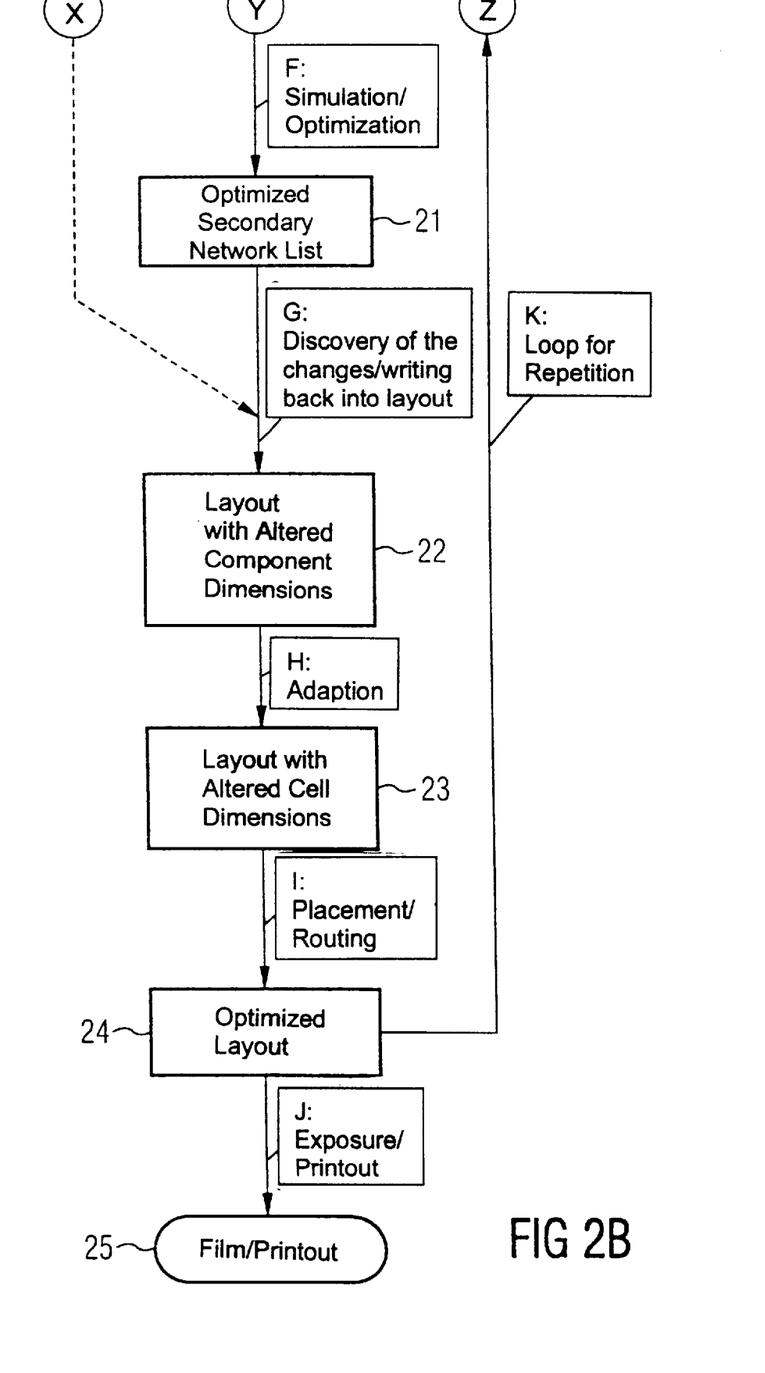

FIG. 2 shows, as flow diagram, an exemplary embodiment of the present invention. In this case, a VHDL or Verilog description (10) of the integrated circuit to be optimized is created and, in step A, subjected to a synthesis, that is to say the creation of a cell-based network list 13. As an alternative, a cell-based network list 13 can be generated from a schematics 11, whose information is obtained by the extraction in step B, or by means of a data path generator 12. Since customary tools for generating such a cell-based network list 13 can only operate with fixed cell sizes, i.e. predetermined cell definitions, this cell-based network list contains references to a standard cell library 14.

The actual inventive method is based on the use of a cell-based network list with references to parameterizable cells. By way of example, when a normal synthesis program is used, it is thus necessary for the network list generated in the synthesis to be made parameterizable. This is done by the conversion in step C of FIG. 2. The process here is either that, without changes to the actual CBN 13, merely the standard cell library is exchanged for a reference library 17, which in turn contains references and parameters which refer to a variable cell library 18 with definitions of parameterizable cells. As an alternative, the CBN 16 can be modified in such a way that each reference to a cell of the standard cell library 14 is exchanged for a reference to a parameterizable cell of a variable cell library 15, the dimensioning parameters of the former standard cell being included in the CBN 16.

The placement in step D determines the arrangement of the cells on the integrated circuit, while the routing effects the electrical connection of the individual cells to one another by interconnects. The result of the placement/routing step is a layout 19 with parameterizable cells.

A simulatable prototype in the form of a primary network list 20 is generated from this layout with the aid of an extraction program in step E. In step F, said primary network list is subjected to a simulation in order to check whether the circuit planned in this way satisfies the requirements. If the requirements are not fulfilled, the behavior of the circuit is optimized with the aid of an optimization program. This optimization leads to an optimized secondary network list 21, which, by adjustment of the designators in step G, can again be assigned to the cells of the layout 19. The altered dimension parameters of altered components are entered into the layout, resulting in a layout 22 with altered component dimensions.

In step H, the layout adaptation according to the invention is performed, which leads to a layout 23 with altered cell dimensions, in which cell fit faults such as overlaps or gaps can occur as a result of recalculation of the cell dimensions now necessary, on account of the altered component dimensions.

Therefore, in step I, a further, simpler placement and routing is performed, which can be carried out with the aid of specially developed programs having a lower degree of complexity than in the case of conventional placement/routing programs. This placement and routing generates an optimized layout 24 with the desired optimized modes of behavior and a modified arrangement of the altered cells. The sequence may have to be iterated a number of times in order to be able to fulfill the requirement imposed on the circuit, as is indicated by the loop in step K. In terms of its format, the optimized layout 24 corresponds to the original layout 19, so that it can be used directly for extraction and subsequent simulation.

The method according to the invention will be explained below using an example of a design with variable standard cells. Such a circuit has the property that all the cells in a row must have the same height in order that the power supply tracks are electrically connected to one another.

Figure 3A:
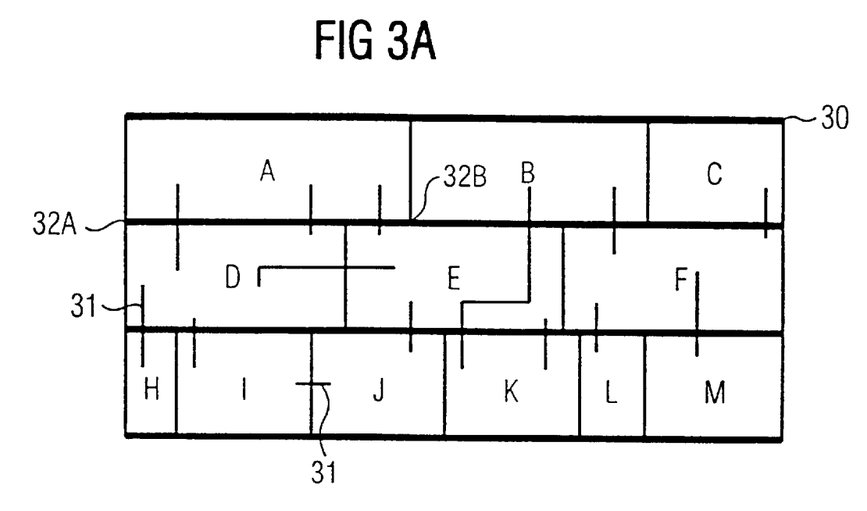
FIGS. 3a to 3d are diagrams illustrating different stages of the optimization method according to the invention using an exemplary cell configuration.

As shown in FIG. 3a, the cells a to m are placed and interconnected for example in accordance with the specifications of the VHDL description of the circuit. The power supplies 30 and the interconnections 31 between the cells are depicted by way of example. FIG. 3a shows a graphical reproduction of the layout, as can be generated by corresponding output programs. All that are illustrated here by way of example are the contours of the individual cells, as can be obtained upon selection of the view "Abstract". The cells are arranged in the layout by allocation of coordinates to the reference points 32A, 32B, etc., of the cells a to m, which are the bottom left corner of the cells in the example illustrated. However, the reference points can be chosen as desired within the cells, for example one of the other corners or the central point of the cells.

Figure 3B:
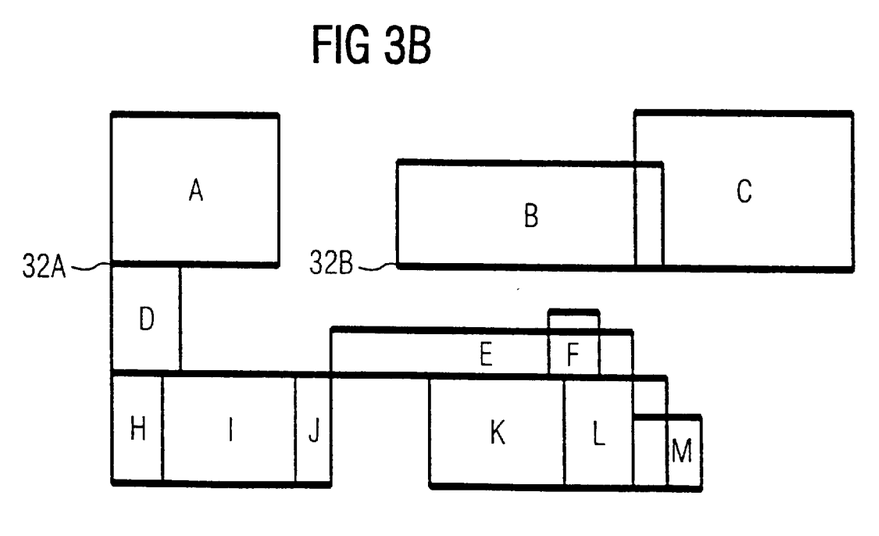
Figure 3C:
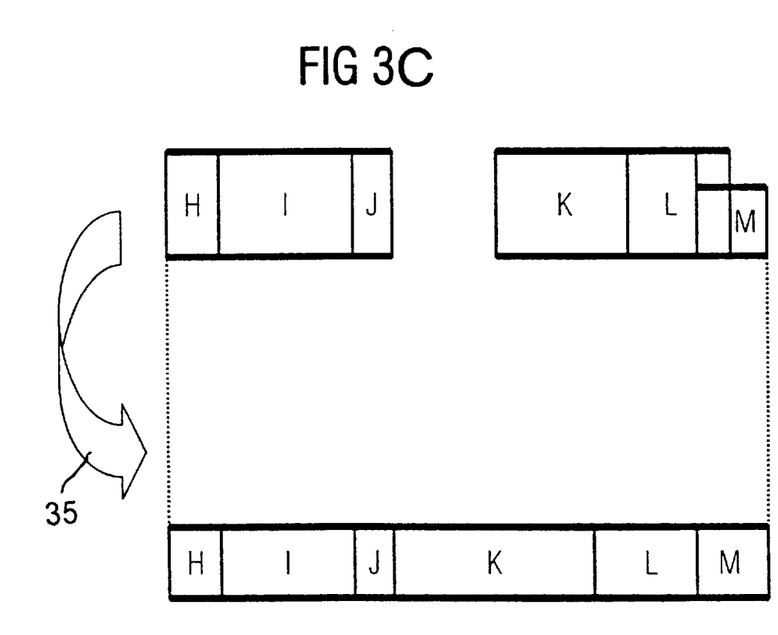
Figure 3D:
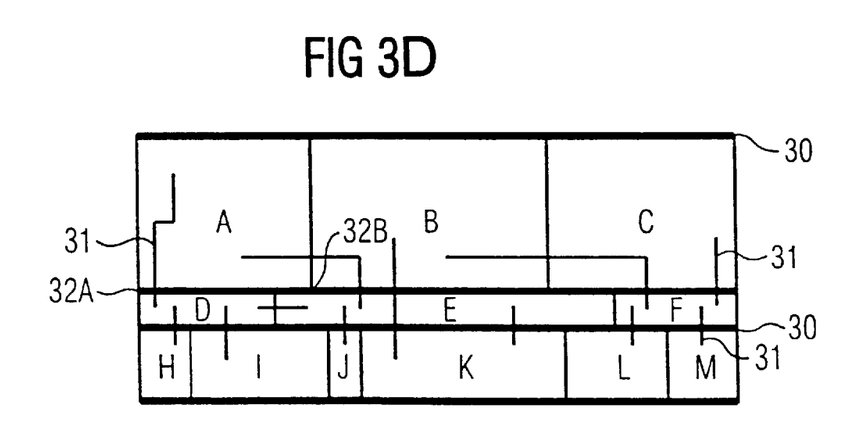

A primary network list 20 is generated from this layout. It is simulated and optimized according to the invention. The resultant, if appropriate altered, component dimensionings are read from the secondary network list and allocated to the individual cells of the layout. The latter are accordingly adapted and become smaller or larger, as is shown in FIG. 3b. This results in both overlaps and gaps in the layout since, although the coordinates of their reference points 32A, 32B, etc. have not. A suitable adaptation and placement/routine program now recalculates the cell dimensioning, so that the cells of each row are brought to a uniform height, thereby ensuring that the power supply tracks can be connected to one another. As a result, as indicated by arrow 35 in FIG. 3c, some cells become wider and other become narrower, as is shown in FIG. 3c for the third rows of the exemplary circuit of FIG. 3b. Afterward, the cells are placed next to one another, so that the power supply tracks are actually connected. For this purpose, the coordinates of the reference points 31A, 32B . . . are also displaced. Finally, the cells are interconnected with one another, as is shown in FIG. 3d. If the simulation has revealed that the circuit still does not comply with the requirements, the entire operation is repeated once again or a number of times.

The invention uses a layout with references to parameterizable cells into which are entered altered dimensions of optimized components obtained by simulation/optimization of the layout. The layout modified in this way is recalculated, the relative arrangement of the cells being preserved but their size and dimensioning and also their reference points being adapted to the altered component dimensions. The new layout has e.g. an optimized circuit in which the cells of a row have the same height but different widths.

We claim:

1. A method for optimizing a layout of cells of an integrated circuit, which comprises:

generating a cell-based basic network list from one of a group consisting of:
      a circuit description;
      a schematic; and
      a data path generator, each containing references to cell definitions of a standard cell library with fixed dimensions;
   identifying suitable cell definitions of a cell library with parameterizable dimensions for at least one of the cells of the cell-based basic network list;
   generating a cell-based network list from the cell-based basic network list, the cell-based basic network list utilizing corresponding references to appropriate cell definitions of the cell library with parameterizable dimensions instead of the references to cell definitions of the standard library, the references containing, in the cell-based network list, additional details about the component dimensions, the component dimensions transferable as parameters to the cell definitions and corresponding to the respective dimensions of the cell definitions of the standard cell library to which the references of the cell-based basic network list refer;
   calculating a layout of an integrated circuit utilizing the cell-based network list, the integrated circuit having components with component dimensions and cells with cell dimensions;
   extracting a primary network list from the layout;
   optimizing the component dimensions of at least one of the components of the integrated circuit utilizing at least one predetermined optimization parameter and a simulation utilizing the primary network list;
   creating an optimized secondary network list utilizing the results of the component optimization; and
   automatically modifying the layout with respect to the cell dimensions utilizing the secondary network list.

2. The method according to claim 1, which further comprises transferring details about the parameterizable dimensions of cells into the layout.

3. A method for optimizing a layout of cells of an integrated circuit, which comprises:

providing a cell-based network list with references to cell definitions having parameterizable dimensions;
   calculating a layout of an integrated circuit utilizing the cell-based network list, the integrated circuit having components with component dimensions and cells with cell dimensions;
   extracting a primary network list from the layout;
   optimizing the component dimensions of at least one of the components of the integrated circuit utilizing at least one predetermined optimization parameter and a simulation utilizing the primary network list;
   creating an optimized secondary network list utilizing the results of the component optimization;
   automatically modifying the layout with respect to the cell dimensions utilizing the secondary network list; and
   disposing the cells in the layout in rows, all of the cells belonging to a given row having the same height.

4. The method according to claim 1, wherein the at least one predetermined optimization parameter is at least one of a group consisting of:
   a switching speed of the integrated circuit;
   an area requirement of the circuit;
   a power loss of the circuit; and
   a weighted combination of the at least one predetermined optimization parameter.

5. A method for optimizing the layout of cells of an integrated circuit, which comprises:

providing a cell-based network list with references to cell definitions having parameterizable dimensions;
   calculating a layout of an integrated circuit utilizing the cell-based network list, the integrated circuit having components with component dimensions and cells with cell dimensions;
   extracting a primary network list from the layout;
   optimizing the component dimensions of at least one of the components of the integrated circuit utilizing at least one predetermined optimization parameter and a simulation utilizing the primary network list;
   creating an optimized secondary network list utilizing the results of the component optimization;
   automatically modifying the layout with respect to the cell dimensions utilizing the secondary network list; and
   wherein the at least one predetermined optimization parameter is at least one of a group consisting of:
      a switching speed of the integrated circuit;
      an area requirement of the circuit;
      a power loss of the circuit; and
      a weighted combination of the switching speed of the integrated circuit, the area requirement of the circuit, and the power loss of the circuit.

6. A method for optimizing a layout of cells of an integrated circuit, which comprises:

providing a cell-based network list with references to cell definitions having parameterizable dimensions;
   calculating a layout of an integrated circuit utilizing the cell-based network list, the integrated circuit having components with component dimensions and cells with cell dimensions;
   extracting a primary network list from the layout;
   optimizing the component dimensions of at least one of the components of the integrated circuit utilizing at least one predetermined optimization parameter and a simulation utilizing the primary network list by
      simulating the integrated circuit utilizing the primary network list;
      discovering a critical signal path in the simulated circuit; and
      optimizing a behavior of the critical signal path by varying the component dimensions of the cells contained in the critical signal path;
   creating an optimized secondary network list utilizing the results of the component optimization; and
   automatically modifying the layout with respect to the cell dimensions utilizing the secondary network list.

7. A method for optimizing a layout of cells of an integrated circuit, which comprises:
   providing a cell-based network list with references to cell definitions having parameterizable dimensions;
   calculating a layout of an integrated circuit utilizing the cell-based network list, the integrated circuit having components with component dimensions and cells with cell dimensions;
   extracting a primary network list from the layout;
   optimizing the component dimensions of at least one of the components of the integrated circuit utilizing at least one predetermined optimization parameter and a simulation utilizing the primary network list by
      creating a secondary network list identical to the primary network list; and
      modifying component dimensions in the secondary network list utilizing the results of the component optimization;
   creating an optimized secondary network list utilizing the results of the component optimization; and
   automatically modifying the layout with respect to the cell dimensions utilizing the secondary network list.

8. The method according to claim 1, which further comprises repeating the optimizing step.

9. The method according to claim 1, which further comprises repeating the optimizing step, the creating an optimized secondary network list step, and the automatically modifying step.

10. A method for optimizing a layout of cells of an integrated circuit, which comprises:
    providing a cell-based network list with references to cell definitions having parameterizable dimensions;
    calculating a layout of an integrated circuit utilizing the cell-based network list, the integrated circuit having components with component dimensions and cells with cell dimensions;
    extracting a primary network list from the layout;
    optimizing the component dimensions of at least one of the components of the integrated circuit utilizing at least one predetermined optimization parameter and a simulation utilizing the primary network list;
    creating an optimized secondary network list utilizing the results of the component optimization; and
    automatically modifying the layout with respect to the cell dimensions utilizing the secondary network list by:
       comparing the secondary network list with the primary network list;
       discovering components having changed dimensions as a result of the optimization;
       defining designators of the changed components;
       discovering cells in the layout associated with the components having the defined designators; and
       entering the component dimensions of the discovered components in accordance with the values of the secondary network list into the modified layout.

11. The method according to claim 10, which further comprises carrying out the automatic modification step by also adapting cell properties of cells with changed component dimensions to altered component dimensions.

12. The method according to claim 11, wherein the cells each have a height and a width, and which further comprises adapting cells to the changed component dimensions by altering at least one of a group consisting of the height and the width of the cells.

13. The method according to claim 11, which further comprises adapting cells to the changed component dimensions by division of an original cell into a plurality of target cells having, when connected together, the same electrical properties as the original cell.

14. The method according to claim 11, which further comprises adapting cells to the changed component dimensions by division of a changed original component into a plurality of target components having, when connected together, the same electrical properties as the original components.

15. The method according to claim 11, wherein:
    the cells each have a height and a width; and
    the cells are disposed in rows where all the cells of a given row have the same height; and which further comprises adapting the cells to the changed component dimensions by changing the width of the cells.

16. The method according to claim 1, which further comprises carrying out the automatic modification step by:
    placing the cells on the integrated circuit; and
    interconnecting the cells.

17. The method according to claim 1, which further comprises carrying out the generating a cell-based network list step, the calculating step, the extracting step, the optimizing step, the creating step, and the automatically modifying step with a data processing program.

18. A method for optimizing a layout of cells of an integrated circuit, which comprises:
    providing a cell-based network list with references to cell definitions having parameterizable dimensions wherein the cells have reference coordinates and the layout has external boundary conditions, and which further comprises effecting a placement of the cells without gaps by adapting reference coordinates of the cells to the changed cell dimensions, the relative positions of the cells with respect to one another remaining unchanged provided that no external boundary conditions of the overall layout are violated;
    calculating a layout of an integrated circuit utilizing the cell-based network list, the integrated circuit having components with component dimensions and cells with cell dimensions;
    extracting a primary network list from the layout;
    optimizing the component dimensions of at least one of the components of the integrated circuit utilizing at least one predetermined optimization parameter and a simulation utilizing the primary network list;
    creating an optimized secondary network list utilizing the results of the component optimization; and
    automatically modifying the layout with respect to the cell dimensions utilizing the secondary network list.

19. A method for optimizing a layout of cells of an integrated circuit, which comprises:
    providing a cell-based network list with references to cell definitions having parameterizable dimensions;
    calculating a layout of an integrated circuit utilizing the cell-based network list, the integrated circuit having components with component dimensions and cells with cell dimensions;
    extracting a primary network list from the layout;
    optimizing the component dimensions of at least one of the components of the integrated circuit utilizing at least one predetermined optimization parameter and a simulation utilizing the primary network list;
    creating an optimized secondary network list utilizing the results of the component optimization;

automatically modifying the layout with respect to the cell dimensions utilizing the secondary network list; and grouping the providing step, the calculating step, the extracting step, the optimizing step, the creating step, and the automatically modifying step into data processing programs.

20. The method according to claim 19, which further comprises calling the data processing programs in a coordinated manner with scripts.

21. An apparatus for configuring integrated circuits having components with component dimensions, and cells with cell dimensions, comprising:

at least one computing unit; and a memory for storing:
   a database;
   a primary network list;
   a secondary network list; and
   a program to be executed on said at least one computing unit; and said program configured:
   to generate a cell-based basic network list from one of
      a group consisting of:
         a circuit description;
         a schematic; and
         a data path generator, each containing references to cell definitions of a standard cell library with fixed dimensions;
   to identify suitable cell definitions of a cell library with parameterizable dimensions for at least one of the cells of the cell-based basic network list;
   to generate a cell-based network list from the cell-based basic network list, the cell-based basic network list utilizing corresponding references to appropriate cell definitions of the cell library with parameterizable dimensions instead of the references to cell definitions of the standard library, the references containing, in the cell-based network list, additional details about the component dimensions, the component dimensions transferable as parameters to the cell definitions and corresponding to the respective dimensions of the cell definitions of the standard cell library to which the references of the cell-based basic network list refer;
   to calculate a layout of an integrated circuit utilizing said cell-based network list;
   to extract said primary network list from said layout;
   to optimize the component dimensions of at least one of the components of the integrated circuit utilizing at least one predetermined optimization parameter and a simulation utilizing said primary network list;
   to create an optimized secondary network list utilizing results of component optimization; and
   to automatically modify said layout with respect to the cell dimensions utilizing said optimized secondary network list.

* * * * *